(12) United States Patent  (10) Patent No.: US 8,536,649 B2
Wang et al.  (45) Date of Patent: Sep. 17, 2013

(54) METHOD TO REDUCE THRESHOLD VOLTAGE VARIABILITY WITH THROUGH GATE WELL IMPLANT

(75) Inventors: Geng Wang, Stormville, NY (US); Joseph Ervin, Wappingers Falls, NY (US); Jeffrey B. Johnson, Essex Junction, VT (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/608,860

(22) Filed: Sep. 10, 2012

(65) Prior Publication Data

US 2012/0326233 A1  Dec. 27, 2012

Related U.S. Application Data

(62) Division of application No. 12/862,048, filed on Aug. 24, 2010, now Pat. No. 8,298,884.

(51) Int. Cl.
*H01L 29/66* (2006.01)

(52) U.S. Cl.
USPC .............. 257/336; 257/347; 257/E27.112

(58) Field of Classification Search
USPC .................. 257/336, 347, E27.112
See application file for complete search history.

(56) References Cited

U.S. PATENT DOCUMENTS

| 7,767,536 | B2 | 8/2010 | Kim |
| 2004/0058489 | A1 | 3/2004 | Arai |
| 2008/0121992 | A1 | 5/2008 | Yi et al. |
| 2009/0256201 | A1* | 10/2009 | Yang et al. ............. 257/347 |

OTHER PUBLICATIONS

U.S. Appl. No. 12/701,972 entitled "Through-Gate Implant for Body Dopant", filed Feb. 8, 2010, first named inventor Geng Wang.

* cited by examiner

*Primary Examiner* — Phat X Cao
(74) *Attorney, Agent, or Firm* — Scully, Scott, Murphy & Presser, P.C.; H. Daniel Schnurmann

(57) ABSTRACT

The present disclosure provides a semiconductor device that may include a substrate including a semiconductor layer overlying an insulating layer. A gate structure that is present on a channel portion of the semiconductor layer. A first dopant region is present in the channel portion of the semiconductor layer, in which the peak concentration of the first dopant region is present within the lower portion of the gate conductor and the upper portion of the semiconductor layer. A second dopant region is present in the channel portion of the semiconductor layer, in which the peak concentration of the second dopant region is present within the lower portion of the semiconductor layer.

20 Claims, 3 Drawing Sheets

METHOD TO REDUCE THRESHOLD VOLTAGE VARIABILITY WITH THROUGH GATE WELL IMPLANT

CROSS REFERENCE TO RELATED APPLICATION

This application is a divisional of U.S. patent application Ser. No. 12/862,048, filed Aug. 24, 2010, the entire content and disclosure of which is incorporated herein by reference.

BACKGROUND

The present disclosure relates to semiconductor devices and methods for forming semiconductor devices. More particularly, an implant process is provided for doping the channel of a semiconductor substrate through a gate structure.

The ever increasing scale of integration of integrated circuits has resulted in increasingly smaller device dimensions and has further resulted in device components being positioned closer and closer together in a semiconductor substrate. The close proximity of device structures results in problems in isolating device structures. For example, the demand for increasingly higher scales of integration of integrated circuits has resulted in field effect transistors in which the source regions and drain regions of the transistors are positioned closer and closer together. In this particular circumstance, the close proximity of the source region and the drain region can result in electrical conduction between the source region and drain region that is not responsive to the formation of a conductive channel in the substrate as a result of activation of the gate of the transistor.

Particularly, if the device is of the partially depleted silicon on insulator type (PD-SOI), the buried insulator or other device components that are in close proximity to the source region and drain region can function as an undesirable back gate of the device and facilitate leakage. Once the back channel leakage exceeds a limit under which the field effect transistor is designed to work, the transistor is no longer operating in a desired manner, which can negatively affect the overall operation of the integrated circuit and can possibly result in circuit non-functionality.

SUMMARY

The present disclosure provides a method of forming a semiconductor device that includes doping the semiconductor device's channel region. In one embodiment, the method includes forming an isolation region through the semiconductor layer of a substrate, wherein the isolation region defines a device region of the substrate. A gate conductor is formed having a first portion over a channel portion of the semiconductor layer in the device region of the substrate and a second portion over the isolation regions. A first upper surface of the first portion of the gate conductor is separated from the upper surface of the channel portion of the semiconductor layer by a first distance, and a second upper surface of the second portion of the gate conductor is separated from the upper surface of the isolation regions by a second distance, wherein the first distance is greater than the second distance. A first dopant is implanted through the gate conductor into the channel portion of the semiconductor layer, wherein the peak concentration of the first dopant is in a first implant region that extends from the lower portion of the gate conductor to the upper portion of the semiconductor layer. A second dopant is implanted through the gate conductor into the channel portion of the semiconductor layer, wherein the peak concentration of the second dopant is in a second implant region that is present in the lower portion of the semiconductor layer.

In another aspect, a semiconductor device is provided that may include a gate structure that is present on a channel portion of a semiconductor layer of a substrate. A first dopant region is present in the channel portion of the semiconductor layer, in which the peak concentration of the first dopant region is present within the lower portion of the gate conductor and the upper portion of the semiconductor layer. A second dopant region is present in the channel portion of the semiconductor layer, in which the peak concentration of the second dopant region is present within the lower portion of the semiconductor layer.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE INVENTION

Figure 1:
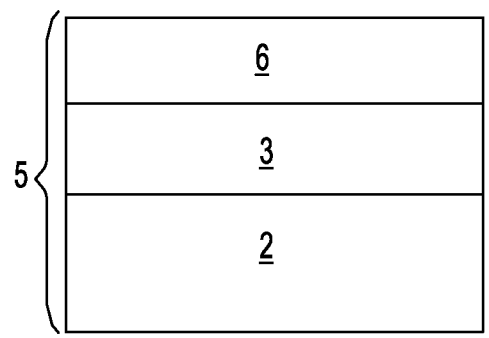
FIG. 1 is a side cross-sectional view depicting a substrate composed of a semiconductor layer atop an insulating layer, in accordance with one embodiment of the present disclosure.

Detailed embodiments of the present disclosure are described herein; however, it is to be understood that the disclosed embodiments are merely illustrative of the invention that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to semiconductor devices in which the channel region of the device is doped through the gate structure using ion implantation (hereafter referred to as through-gate implantation). As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. In one embodiment, the semiconductor device that is provided by the present disclosure is a field effect transistor. A field effect transistor is a semiconductor device in which output current, i.e., source-drain current, is controlled by the voltage applied to a gate structure. A field effect transistor has three terminals, i.e., gate structure, source and drain. The gate structure is a structure used to control output current, i.e., flow of carriers in the channel, of a semiconducting device, such as a field effect transistor, through electrical or magnetic fields. The channel is the region between the source and drain of a semiconductor device that becomes conductive when the semiconductor device is turned on. The source region is a doped region in the semiconductor device, in which majority carriers are flowing into the channel. The drain region is the doped region in semiconductor device located at the end of the channel, in which carriers are flowing out of the semiconductor device through the drain region. In one embodiment, a through-gate ion implantation is provided that produces a first dopant region and a second dopant region in the channel portion of a semiconductor layer of a semiconductor on insulator (SOI) substrate. The channel portion of the semiconductor layer is the location of the channel of the semiconductor device that is formed on the semiconductor layer.

Through-gate implantation to dope the channel of the semiconductor device with p-type or n-type dopants provides for process simplification, increased back channel threshold voltage (Vt) control in partially depleted semiconductor on insulator devices (PDSOI), and source and drain junctions that reliably extend down to the top of the buried oxide layer. This characteristic of the SOI source and drain junctions is termed 'butting'. Butted source and drain junctions may be a requirement in SOI transistors as they isolate adjacent devices that share the same contiguous silicon region. However, the peak dopant concentration in the channel of the semiconductor layer produced by the through-gate implant is affected by the thickness of the gate structure, i.e., thickness of the gate conductor, that the dopant is being ion implanted through. The thickness of the gate conductor typically varies dependent upon the peaks and recesses that are present on the surface that the gate conductor is formed on.

For example, the gate conductor is typically present over the channel portion of the semiconductor device, as well as being present on the upper surface of isolation regions, in which there is a step height difference between the upper surface of the isolation regions and the upper surface of the semiconductor layer that contains the channel of the semiconductor device. Large deviations in the relative surface positions of the semiconductor layer and its adjacent isolation regions can create large deviations in the final thickness of the gate material over the semiconductor material This step height difference causes the dopant from the through gate implant to be present at a different depth in the isolation regions than in the channel portion of the semiconductor device. The difference in dopant depth results in a threshold voltage variation. The threshold variation may result from scattering and overlap of the dopants at the interface of the isolation regions and the channel portion of the semiconductor layer.

In one embodiment, the present disclosure overcomes the aforementioned threshold voltage variation with a through-gate ion implantation that provides a doped channel of a semiconductor layer including a first dopant region (hereafter "first channel implant region") and a second dopant region (hereafter "second channel implant region"). The peak concentration of the first dopant in the first implant region may extend from the lower portion of the gate conductor to the upper portion of the semiconductor layer, and the peak concentration of the second dopant in the second implant region may be present in the lower portion of the semiconductor layer. In one embodiment, the first channel implant region may be present in the channel portion of the semiconductor layer, in which the peak concentration of the first channel implant region is present within the lower 25% of the thickness of the gate conductor and the upper 25% of the thickness of the semiconductor layer that is underlying the gate conductor. In one embodiment, the second channel implant region may be present in the channel portion of the semiconductor layer, in which the peak concentration of the second implant channel region is present within the lower 25% of thickness of the semiconductor layer containing the channel of the semiconductor device.

In one embodiment, in which the semiconductor device is formed on a semiconductor on insulator (SOI) substrate, the second channel implant region is positioned proximate to the interface of the channel portion of the semiconductor layer, i.e., semiconductor on insulator (SOI), and the underlying dielectric layer in order to provide a low front channel threshold voltage (Vt) and a high back channel threshold voltage (Vt). The first channel implant region is positioned closer to the gate conductor and provides a high front channel threshold voltage (Vt). When the thickness of the gate conductor is increased, the implant peak of the second channel implant region may move towards the front channel and increases the threshold voltage (Vt) of the front channel. When the thickness of the gate conductor is increased, the implant peak of the first channel implant region may move into the gate conductor, which reduces the impact of the first channel implant region on the threshold voltage of the front channel device, i.e., device controlled by the gate structure 10. By combining the shallow implant concentration peak of the first channel implant region with the deep implant concentration of the second channel implant region, the threshold voltage variation that results from the difference in gate conductor thickness may be substantially suppressed. In one example, the increase in the threshold voltage in the device corresponding to the gate structure that results from the peak concentration of dopant in the second channel implant region, is offset by the decrease in the threshold voltage in the front gate structure that is provided by the peak concentration of dopant in the first dopant region.

FIG. 1 depicts one embodiment of a substrate 5 suitable for forming a semiconductor device having a channel dopant region produced by a through gate implant. In one embodiment, the substrate 5 includes an SOI substrate. An SOI substrate includes a top semiconductor layer 6 (i.e., active semiconductor layer, which is also referred to as an SOI layer 6 or semiconductor layer 6) atop an insulating layer 3, i.e., buried insulating layer. The semiconductor layer 6 may comprise one of Si, Ge alloys, SiGe, GaAs, InAs, InP, SiCGe, SiC as well as other III/V or II/VI compound semiconductors. In one embodiment, the semiconductor layer 6 has a thickness from 3 nm to 100 nm, and the insulating layer 3 has a thickness ranging from 10 nm to 150 nm. The insulating layer 3 may be a crystalline or non-crystalline oxide or nitride. A base semiconductor substrate layer 2 may be present under the insulating layer 3. The base semiconductor substrate layer 2 may comprise one of Si, Ge alloys, SiGe, GaAs, InAs, InP, SiCGe, SiC as well as other III/V or II/VI compound semiconductors.

It is noted that although an SOI substrate is depicted and described in the following discussion, embodiments of the present invention have been contemplated that utilize a bulk semiconductor substrate. In another embodiment of the present invention, in which a bulk semiconductor substrate is used, the bulk semiconductor substrate comprises one of Si, Ge alloys, SiGe, GaAs, InAs, InP, SiCGe, SiC as well as other III/V or II/VI compound semiconductors.

Figure 2:
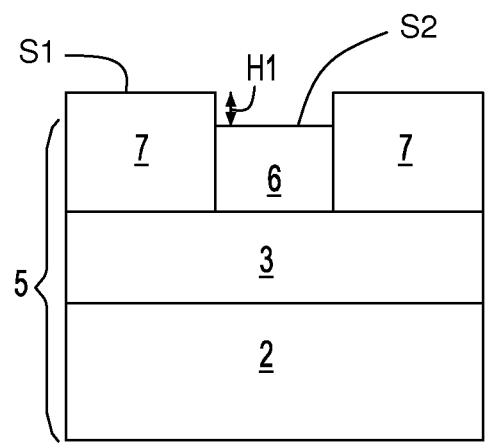
FIG. 2 is a side cross-sectional view depicting forming an isolation region through the semiconductor layer, wherein the isolation region defines a device region of the semiconductor layer of the substrate, in accordance with one embodiment of the present disclosure.

FIG. 2 depicts one embodiment of forming an isolation region 7 through the semiconductor layer 6. The isolation region 7 defines a device region of the substrate 5. The device region contains the semiconductor devices that are forming on the substrate 4. The isolation region 7 may be a trench formed into the semiconductor substrate 5 that is filled with an insulating material, such as an oxide, nitride, or oxynitride. In a further embodiment, the shallow trench isolation region 7 may be formed by etching a trench in the substrate 5 utilizing a dry etching process, such as reactive-ion etching (RIE) or plasma etching.

More specifically, and in one example, a photoresist mask is formed over a portion of the upper surface of the semiconductor layer 6, in which the trench for the isolation region 7 is subsequently formed. The photoresist mask (not shown) may be formed by depositing a photoresist layer, exposing the photoresist layer to a pattern of radiation, and then developing the pattern into the photoresist layer utilizing a resist developer. Once the patterning of the photoresist mask is completed, the sections of the semiconductor layer 6 covered by the photoresist mask are protected while the exposed sections of the semiconductor layer 6 are removed using a selective etching process to provide a trench. As used herein, the term "selective" in reference to a material removal process denotes that the rate of material removal for a first material is greater than the rate of removal for at least another material of the structure to which the material removal process is being applied. For example, in one embodiment, the etch process that forms the trench may include an etch chemistry that removes the semiconductor layer selective to the buried insulation layer 3.

In one example, the transferring of the pattern provided by the photoresist mask through the underlying portions semiconductor layer 6 may include an anisotropic etch. An anisotropic etch process is a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

Still referring to FIG. 2, the trench may then be filled with a dielectric material. In one embodiment, chemical vapor deposition or another like deposition process may be used to fill the trench with polysilicon or another like STI dielectric material, such as an oxide. Chemical Vapor Deposition (CVD) is a deposition process in which a deposited species is formed as a results of chemical reaction between gaseous reactants at an elevated temperature (typically being greater than 200° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others. Other examples of methods for depositing the dielectric material within the trench include spinning from solution, spraying from solution, ion-beam deposition, and evaporation. Following deposition, the dielectric material that extends from the trench onto the upper surface of the semiconductor layer 6 may be removed using selective etch or planarization. Regardless of the method used to remove the dielectric material that extends from the trench onto the upper surface of the semiconductor layer 6, a difference in height is typically presented between the upper surface of the isolation region 7 and the upper surface of the semiconductor layer 6. This difference in height between the upper surface of the isolation region 7 and the upper surface of the semiconductor layer 6 may be referred to as a "step height".

In one embodiment, the upper surface S1 of the isolation region 7 is vertically offset from the upper surface S2 of the semiconductor layer 6 by a step height H1 of less than 30 nm.

The step height H1 will vary from device to device on a substrate due to the manufacturing variations. In one embodiment, the upper surface S1 of the isolation region 7 is vertically offset from the upper surface S2 of the semiconductor layer 6 by a step height H1 ranging from 5 nm to 30 nm. In another embodiment, the upper surface S1 of the isolation region 7 is vertically offset from the upper surface S2 of the semiconductor layer 6 by a step height H1 ranging from 10 nm to 25 nm. In yet another embodiment, the upper surface S1 of the isolation region 7 is vertically offset from the upper surface S2 of the semiconductor layer 6 by a step height H1 ranging from 5 nm to 20 nm.

Referring to FIGS. 3A, 3B, 3C and 3D, a gate structure 10, i.e., front gate structure, is typically formed on a channel portion of the semiconductor layer 6 within the device region of the substrate 5. The gate structure 10 typically includes at least one gate dielectric 8 and at least one gate conductor 9. Opposite the front gate structure 10 is a back gate structure that is present within the substrate 5. The gate dielectric of the back gate is the insulating layer 3 and the gate conductor is the silicon of base semiconductor substrate layer 2 and any proximate structures residing therein. In some applications, the loss of back gate control is disadvantageous for circuit operation and control of this parasitic transistor structure.

Figure 3A:
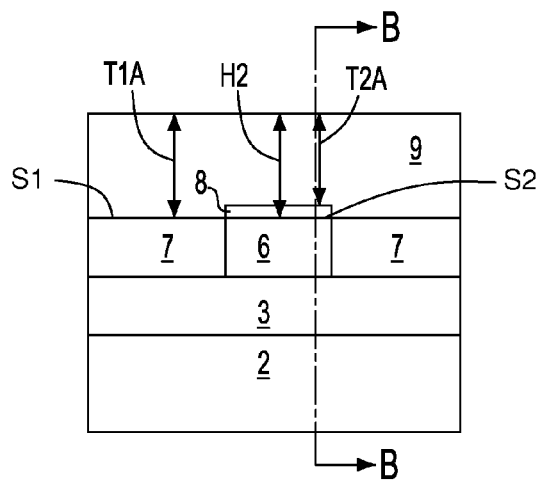
FIG. 3A is a side cross-sectional view depicting forming a gate conductor on a first portion over a channel portion of the semiconductor layer in the device region of the substrate and a second portion over the isolation regions, in accordance with one embodiment of the present disclosure In this depiction, the isolation regions are coplanar with the semiconductor layer.
Figure 3B:
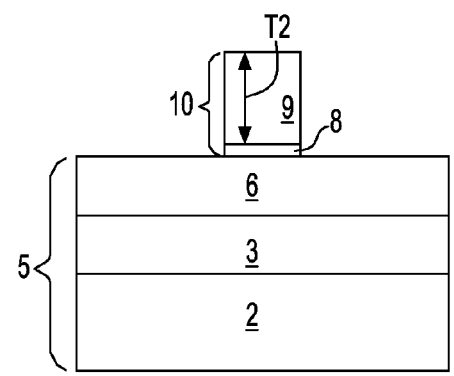
FIG. 3B is a lengthwise, side cross-sectional view of the structure depicted in FIG. 3A along section line B-B, in accordance with one embodiment of the present disclosure.

FIGS. 3A and 3B depict at least one gate conductor 9 formed over a surface in which the upper surface S1 of the isolation region 7 is coplanar with the upper surface S2 of the semiconductor layer 6. In this scenario there is no step height difference between the upper surface S1 of the isolation region 7 and the upper surface S2 of the semiconductor layer 6. In this scenario there is no step height difference between the upper surface S1 of the isolation region 7 and the upper surface S2 of the semiconductor layer 6. FIG. 3A depicts the width of the channel that is present in the semiconductor layer 6. FIG. 3B depicts a cross-sectional view (lengthwise) of the structure depicted in FIG. 3A bisecting the channel width.

Figure 3C:
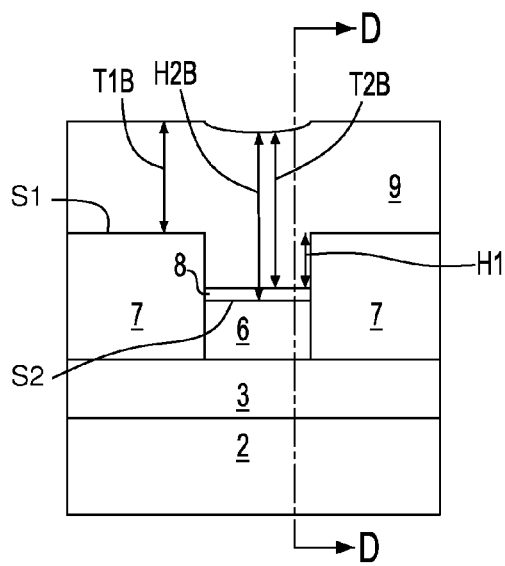
FIG. 3C is a side cross-sectional view depicting forming a gate conductor on a first portion over a channel portion of the semiconductor layer in the device region of the substrate and a second portion over the isolation regions, in accordance with one embodiment of the present disclosure. In this depiction, the isolation regions are thicker than the semiconductor layer.
Figure 3D:
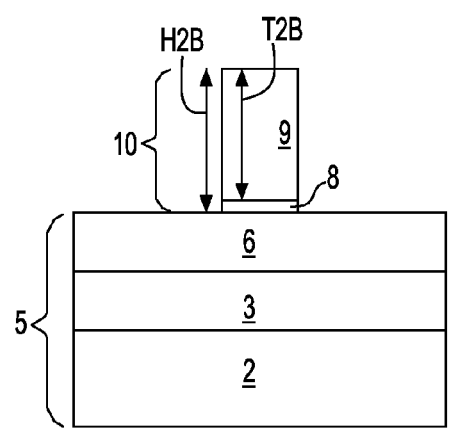
FIG. 3D is a lengthwise, side cross-sectional view of the structure depicted in FIG. 3C along section line B-B, in accordance with one embodiment of the present disclosure.

FIGS. 3C and 3D depict at least one gate conductor 9 formed over a surface in which the upper surface S1 of the isolation region 7 is substantially misaligned from the upper surface S2 of the semiconductor layer 6. More specifically, the upper surface S1 of the isolation region 7 is vertically offset from the upper surface S2 of the semiconductor layer 6 by a step height H1 differential. The step height H1 is the result of manufacturing variations.

The conditions depicted in FIGS. 3A and 3C may be present on the same chip, i.e., substrate 5. Comparison of FIGS. 3A and 3B to FIGS. 3C and 3D illustrated the difference between the gate height H2A when the misalignment between the upper surfaces of the isolation region 7 and the semiconductor layer 6 has been minimized, as depicted in FIGS. 3A and 3B, and the gate height H2B of a structure having substantial misalignment between the upper surfaces of the isolation region 7 and the semiconductor layer 6, as depicted in FIGS. 3C and 3D. Referring to FIGS. 3A and 3D, when the misalignment between the upper surfaces of the isolation region 7 and the semiconductor layer 6 has been minimized, the thickness T1A of the at least one gate conductor 9 over the isolation region 7 is substantially equal to the thickness T2A of the at least one gate conductor 9 over the semiconductor layer 6. Referring to FIGS. 3C and 3D, when substantial misalignment is present between the upper surfaces of the isolation region 7 and the semiconductor layer 6, the thickness that is T1B of the at least one gate conductor 9 over the isolation region 7 is different than the thickness T2B of the at least one gate conductor 9 over the semiconductor layer 6. Typically, the thickness T2B of the at least one gate conductor 9 over the semiconductor layer 6 is greater than the thickness T1B of the at least one gate conductor 9 over the isolation region 7. The increase in the thickness T2B of the at least one gate conductor 9 over the semiconductor layer 6 increases the gate height H2B.

Typically, comparing FIGS. 3B and 3D, when there is substantial misalignment between the upper surfaces of the isolation region 7 and the semiconductor layer 6, the gate height H2B is greater than the gate height H2A of structures in which the misalignment between the upper surfaces of the isolation region 7 and the semiconductor layer 6 has been minimized.

Referring to FIGS. 3C and 3D, the at least one gate dielectric 8 may be a low-k dielectric material (having a dielectric constant equal to or less than 4.0), such as $SiO_2$, or a high-k dielectric (having a dielectric constant greater than 4.0), such as an oxide of Ta, Zr, Al or combinations thereof. Hf-containing high-k dielectrics can also be used. The at least one gate dielectric 9 typically has a thickness of from 1 nm to 10 nm. In one embodiment, the at least one gate dielectric 8 has a thickness of from 1.5 nm to 2.5 nm. The at least one gate dielectric 8 may be formed using a deposition method, such as chemical vapor deposition, or may be formed using a thermal growth method, such as thermal oxidation.

The at least one gate conductor 9 is composed of a conductive material. In one embodiment, the at least one gate conductor 9 is composed of polysilicon. The at least one gate conductor 8 may also be comprised of a conductor selected from the group including, but not limited to, elemental metals, metal alloys, or metal silicides. The at least one gate conductor 9 may be formed using chemical vapor deposition, such as plasma enhanced chemical vapor deposition, or physical vapor deposition, such as plating or sputtering. The thickness of the at least one gate conductor 9 varies due to process variation and particularly, the vertical offset, i.e., step height H1, between the upper surface of isolation region 7 and the upper surface of the channel portion of the semiconductor layer 6 leads to a gate conductor thickness variation over the channel portion of the semiconductor substrate 5.

The thickness of the at least one gate conductor 9 and the at least one gate dielectric 8 may be selected to provide a gate structure 10 height H2B ranging from 40 nm to 200 nm. In another embodiment, the thickness of the at least one gate conductor 9 and the at least one gate dielectric 8 provides a gate structure having a height H2B ranging from 50 nm to 100 nm. FIG. 3C is a cross sectional view bisecting the channel length direction of the device. As illustrated in FIG. 3C, the channel width W1 of the channel portion of the semiconductor layer 6 may range from 30 nm to 200 nm. In another embodiment, the channel width W1 of the channel portion of the semiconductor layer 6 may range from 50 nm to 75 nm. FIG. 3D depicts a cross-sectional view of the structure depicted in FIG. 3A bisecting the channel width, which clearly depicts the gate structure 10.

Referring to FIG. 3D, the gate structure 10 may be formed utilizing photolithography and etching. In one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. The patterned photoresist may be utilized to etch the at least one gate conductor 9 and the at least one gate dielectric 8 to provide the gate structure 10. The at least one gate conductor 9 and the at least one gate dielectric 8 may be etched using an anisotropic etch process, such as a reactive ion etch (RIE).

Following etching of the at least one gate conductor 9 and the at least one gate dielectric 8, the photomask may be removed using a chemical stripping process or oxygen ashing.

Figure 4:
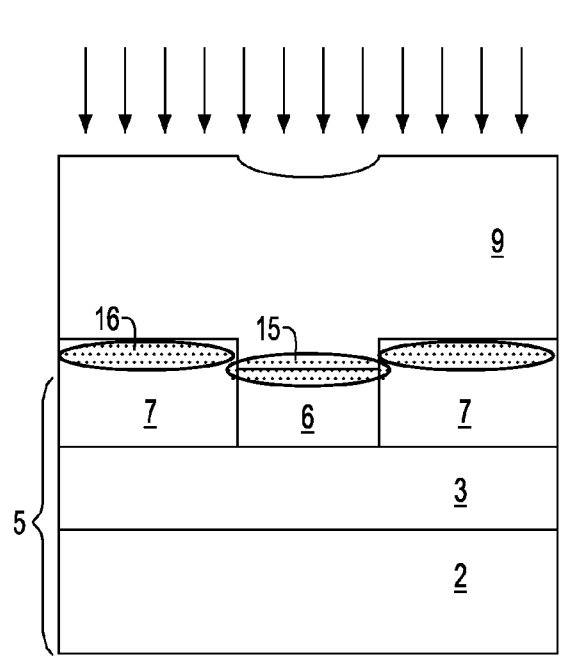
FIG. 4 is a side cross-sectional view depicting a first dopant implanted through the gate conductor into the channel portion of the semiconductor layer, wherein the peak concentration of the first dopant is in a first channel implant region that extends from the lower 25% of the thickness of the gate conductor to the upper 25% of the thickness of the semiconductor layer, in accordance with one embodiment of the present disclosure.

FIG. 4 depicts one embodiment of implanting a first dopant through the at least one gate conductor 9 of the gate structure 10 into the channel portion of the semiconductor layer 6. In one embodiment, the first dopant is implanted through the at least one gate conductor 9 using an ion implantation method. Ion implantation includes ionizing the atoms to be implanted (dopant species), accelerating the dopant species in an electric field, and directing the dopant species toward the surface to be implanted. The depth of the ion implantation is typically determined by the dopant species, ion dose, implant energy, beam current density, the thickness of the semiconductor layer 6, and the height of the gate structure 10 height.

The conditions for ion implantation of the first dopant through the gate structure 10 is selected to provide a peak concentration of the first dopant in a first channel implant region 15 that extends from the lower 25% of the thickness of the at least one gate conductor 9 to the upper 25% of the thickness of the semiconductor layer 6. In one embodiment, the peak concentration of the first dopant of the first channel implant region 15 extends from the lower 15% of the thickness of the at least one gate conductor 9 to the upper 15% of the thickness of the semiconductor layer 6. In yet another embodiment, the peak concentration of the first dopant of the first channel implant region 15 extends from the interface of the gate structure, i.e., gate dielectric 8, and the semiconductor layer 6 to the upper 15% of the thickness of the semiconductor layer 6.

The term "peak concentration" as used to describe the first dopant denotes the region of the channel portion, i.e., first channel implant region 15, of the semiconductor layer 6 having the greatest concentration of the first dopant. In one embodiment, the peak concentration of the first dopant in the first channel implant region 15 ranges from $1 \times 10^{18}$ atoms/cm$^3$ to $5 \times 10^{18}$ atoms/cm$^3$. In another embodiment, the peak concentration of the first dopant in the first channel implant region 15 ranges from $2 \times 10^{18}$ atoms/cm$^3$ to $4 \times 10^{18}$ atoms/cm$^3$. In yet another embodiment, the peak concentration of the first dopant in the first channel implant region 15 ranges from $2.5 \times 10^{18}$ atoms/cm$^3$ to $3.5 \times 10^{18}$ atoms/cm$^3$.

The first implant region 15 is composed of a p-type dopant or an n-type dopant. As used herein, the term "conductivity type" denotes a dopant region being p-type or n-type. As used herein, "p-type" refers to the addition of impurities to an intrinsic semiconductor that create deficiencies of valence electrons, such as boron, aluminum, gallium or indium to an intrinsic Si-containing substrate. As used herein, "n-type" refers to the addition of impurities that contribute free electrons to an intrinsic semiconductor, such as antimony, arsenic or phosphorous to a Si-containing substrate.

In one embodiment, in which the first dopant that provides the first channel implant region 15 is an p-type dopant, the dopant may be composed of boron or indium. In one example, in which the at least one gate conductor 9 is composed of polysilicon and has a thickness ranging from 20 nm to 200 nm, the dopant that provides the first channel implant region 15 may be boron or indium and may include an implant having an ion dosage of $5 \times 10^{12}$ atoms/cm$^2$ or greater with an implant energy of 5 keV to 30 keV. In another example, the implanting of the first dopant comprises an implant energy ranging from 5 keV to 30 keV, and an implant dose ranging from $5 \times 10^{12}$ atoms/cm$^2$ to $5 \times 10^{13}$ atoms/cm$^2$.

In another example, in which the at least one gate conductor 9 is composed of polysilicon and has a thickness ranging from 40 nm to 160 nm, the dopant for the first channel implant region may be boron or indium and may include an implant having an ion dosage ranging from $5 \times 10^{12}$ atoms/cm$^2$ to $5 \times 10^{14}$ atoms/cm$^2$ with an implant energy of 10 keV to 25 keV. In yet another example, in which the at least one gate conductor 9 is composed of polysilicon and has a thickness ranging from 60 nm to 120 nm, the dopant may be boron or indium and may be implanted with an ion dosage of $5 \times 10^{13}$ atoms/cm$^2$ with an implant energy of 15 keV.

In one embodiment, in which the first dopant that provides the first implant region is a p-type dopant, the dopant may be composed of phosphorus. In one example, in which the at least one gate conductor 9 is composed of polysilicon and has a thickness ranging from 20 nm to 200 nm, the dopant may be phosphorus and may include an implant having an ion dosage of $5 \times 10^{12}$ atoms/cm$^2$ or greater with an implant energy of 15 keV to 80 keV. In another example, in which the at least one gate conductor 9 is composed of polysilicon and has a thickness ranging from 40 nm to 160 nm, the dopant may be phosphorus and may include an implant having an ion dosage ranging from $5 \times 10^{12}$ atoms/cm$^2$ to $5 \times 10^{14}$ atoms/cm$^2$ with an implant energy of 25 keV to 65 keV. In yet another example, in which the at least one gate conductor 9 is composed of polysilicon and has a thickness ranging from 60 nm to 120 nm, the dopant may be phosphorus implanted with an ion dosage of $5 \times 10^{13}$ atoms/cm$^2$ with an implant energy of 40 keV.

The implanting of the first dopant through the at least one gate conductor 9 is typically carried out at a temperature ranging from −150° C. to 400° C. In another example, the implanting of the first dopant through the at least one gate conductor 9 is carried out with a temperature ranging from 100° C. to 200° C.

The implanting of the first dopant through the at least one gate conductor 9 typically results in a first isolation implant region 16 that is substantially adjacent to the first channel dopant region 15. The first isolation implant region 16 is implanted through the portion of the at least one gate conductor 9 that is overlying the isolation region. By substantially adjacent it is meant that the peak concentration of the dopant in the first isolation implant region 16 may be vertically offset from the peak concentration of the dopant in the first channel implant region 15 by a distance that is proportional to the step height H2 difference between the upper surface of the isolation region and the upper surface of the semiconductor layer 6. The first isolation implant region 16 may also be present in the source region 55 and a drain region 60, as depicted in FIG. 5B. The first isolation implant region 16 may be of an opposite conductivity type as the source region 55 and a drain region 60. In one embodiment, because the concentration of the dopant for the first isolation implant region 15 that is present in the source region 55 and a drain region 60 is much less than the source and drain dopant concentration, the presence of the first isolation implant region 16 in the source region 55 and a drain region 60 does not affect the functionality of the source region 55 and the drain region 60. The portion of the first isolation implant region 16 that is present in the source region 55 and the drain region 60 is not underlying the at least one gate conductor layer 9.

Figure 5A:
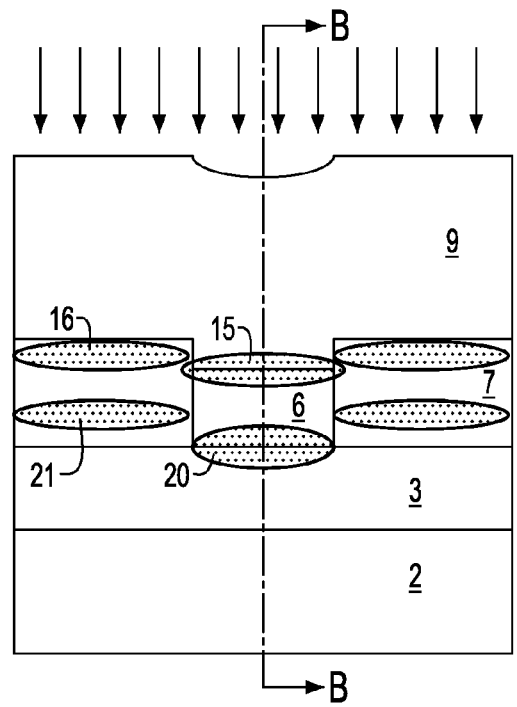
FIG. 5A is a side cross-sectional view depicting a second dopant implanted through the gate conductor into the channel portion of the semiconductor layer, wherein the peak concentration of the second dopant is in a second channel implant region that is present in the lower 25% of thickness of the semiconductor layer, in accordance with one embodiment of the present disclosure.
Figure 5B:
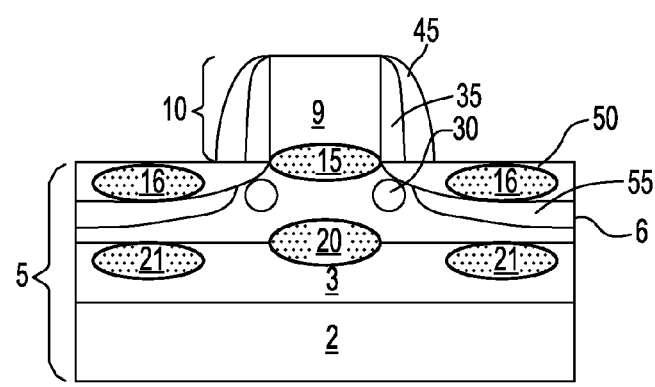
FIG. 5B is a side cross-sectional view of the structure depicted in FIG. 5A along section line B-B, in accordance with one embodiment of the present disclosure.

FIG. 5A depicts a second dopant implanted through the at least one gate conductor 9 into the channel portion of the semiconductor layer 6. The conditions for ion implantation of the second dopant through the gate structure 10 is selected to provide a peak concentration of the second dopant in a second channel implant region 20 is present in the lower 25% of thickness of the semiconductor layer 6. The lower 25% of the thickness of the semiconductor layer 6 extends from the interface of the insulating layer 3 and the semiconductor layer 6. In one embodiment, the peak concentration of the second dopant of the second channel implant region 20 extends from the lower 15% of the thickness of the semiconductor layer 6 to the interface of the semiconductor layer 6 and the underlying buried dielectric layer 3.

The term "peak concentration" as used to describe the second dopant denotes the region of the channel portion, i.e., second channel implant region 20, of the semiconductor layer 6 having the greatest concentration of the second dopant. In one embodiment, the peak concentration of the second dopant in the second channel dopant region 20 ranges from $5 \times 10^{17}$ atoms/cm$^3$ to $4 \times 10^{18}$ atoms/cm$^3$. In another embodiment, the peak concentration of the second dopant in the second channel implant region 20 ranges from $1 \times 10^{17}$ atoms/cm$^3$ to $3 \times 10^{18}$ atoms/cm$^3$. In yet another embodiment, the peak concentration of the second dopant in the second channel implant region 20 ranges from $1 \times 10^{18}$ atoms/cm$^3$ to $2.5 \times 10^{18}$ atoms/cm$^3$.

The second channel implant region 20 is composed of a p-type dopant or an n-type dopant. The second channel implant region 20 may have the same conductivity as the first channel implant region 15.

In one embodiment, in which the second dopant that provides the second implant region 20 is an p-type dopant, the dopant may be composed of boron or indium. In one example, in which the at least one gate conductor 9 is composed of polysilicon and has a thickness ranging from 20 nm to 200 nm, the dopant of the second implant region 20 may be boron or indium and may be implanted into the channel portion of the semiconductor layer 6 using an ion dosage of $5 \times 10^{12}$ atoms/cm$^2$ or greater with an implant energy of 40 keV to 60 keV. In another example, in which the at least one gate conductor 9 is composed of polysilicon and has a thickness ranging from 40 nm to 160 nm, the dopant of the second implant region 20 may be boron or indium and may be implanted into the channel portion of the semiconductor layer 6 with an ion dosage ranging from $5 \times 10^{12}$ atoms/cm$^2$ to $5 \times 10^{14}$ atoms/cm$^2$ with an implant energy of 45 keV to 55 keV. In yet another example, in which the at least one gate conductor 9 is composed of polysilicon and has a thickness ranging from 60 nm to 120 nm, the dopant may be boron or indium and may include an implant having an ion dosage of $5 \times 10^{13}$ atoms/cm$^2$ with an implant energy of 50 keV.

In one embodiment, in which the second dopant that provides the second channel implant region 20 is a n-type dopant, the dopant may be composed of phosphorus. In one example, in which the at least one gate conductor 9 is composed of polysilicon and has a thickness ranging from 20 nm to 200 nm, the second dopant that provides the second channel implant region 20 may be phosphorus and may be implanted with an high ion dosage of $5 \times 10^{12}$ atoms/cm$^2$ or greater with an implant energy of 100 keV to 140 keV. In another example, in which the at least one gate conductor 9 is composed of polysilicon and has a thickness ranging from 40 nm to 160 nm, the dopant may be phosphorus and may be implanted with an ion dosage ranging from $5 \times 10^{12}$ atoms/cm$^2$ to $5 \times 10^{14}$ atoms/cm$^2$ with an implant energy of 110 keV to 130 keV. In yet another example, in which the at least one gate conductor 9 is composed of polysilicon and has a thickness ranging from 60 nm to 120 nm, the dopant may be phosphorus and may include an implant having an ion dosage of $5 \times 10^{13}$ atoms/cm$^2$ with an implant energy of 120 keV.

The implanting of the second dopant through the gate structure 10 is typically carried out at a temperature ranging from −150° C. to 400° C. In another example, the implanting of the second dopant through the at least one gate conductor 9 is carried out with a temperature ranging from 100° C. to 200° C.

The blanket implanting of the second dopant through the at least one gate conductor 9 typically results in a second isolation implant region 21 that is substantially adjacent to the second channel dopant region 20, wherein the second isolation implant region 21 is implanted through the portion of the at least one gate conductor 9 that is overlying the isolation region. By substantially adjacent it is meant that the peak concentration of the dopant in the second isolation implant region 21 may be vertically offset from the peak concentration of the dopant in the second channel implant region 20 by a distance that is proportional to the step height H1 difference between the upper surface of the isolation region 7 and the upper surface of the semiconductor layer 6. Outside of the region covered by the at least one gate conductor 9, the second isolation implant regions 21 may be present in the insulating layer 3, as depicted in FIG. 5B. The presence of the second isolation implant region 21 within the insulating layer 3 does not affect device performance.

Referring to FIG. 5B, in some embodiments, a halo implant 30 is conducted with an angled ion implantation into the portion of the semiconductor layer 6 of the substrate 5 proximate to a channel edge region. The halo implant 30 may be conducted before or after the first channel isolation region 15 and the second channel isolation region 20. Typically, the halo implant 30 is of the same conductivity type as the first channel implant region 15 and second channel implant region 20. In one embodiment, the halo implant 30 is composed of a p-type dopant. In another embodiment, the halo implant 30 is composed of an n-type dopant. The halo implant 30 may be composed of boron atoms. Other examples of halo implants include indium. The halo implant 30 may include an ion implantation process having an ion dosage of $5 \times 10^{12}$ atoms/cm$^2$ or greater, at an energy from 5.0 keV to 60.0 keV, wherein the ion implantation process is angled by a value ranging from 10° to 50°, as measured from a plane normal to the surface of the substrate 5.

The present disclosure may include the formation of a first dielectric spacer 35 adjacent the sidewalls of the gate structure 10. The first dielectric spacer 35 may be composed of an oxide, nitride or oxynitride material. In one example, the first dielectric spacer 35 is an oxide spacer that is formed in direct contact with the sidewalls of the at least one gate conductor 9. In one embodiment, in which the first dielectric spacer 35 is composed of an oxide, the first dielectric spacer 35 may be formed using a conformal deposition process, and may have a thickness ranging from 1 nm to 5 nm.

Following the formation of the first dielectric spacer 35, extension regions 50 are then formed using an ion implantation process. The distance between the extension regions 50 dictates the length of the device. The extension regions 50 may be formed having a dopant conductivity type that is opposite the conductivity type as the dopant of the first channel implant region 15 and the second channel implant region 20, in which the first channel implant region 15 and the second channel implant region 20 have the same conductivity. The extension regions 50 may be composed of a p-type dopant. P-type extension regions are typically produced with group III-A elements. The extension regions 50 may also be composed of an n-type dopant. N-type extension regions are typically produced with group V elements. In the case of the p-type implants, a typical impurity species is boron or $BF_2$. Boron with an energy of 0.2 keV to 3.0 keV or $BF_2$ with an energy of 1.0 keV to 15.0 keV and a dose of $5 \times 10^{13}$ atoms/cm$^2$ to $3 \times 10^{16}$ atoms/cm$^2$ can be used to implant the p-type region. A typical implant for the n-type regions is arsenic. The n-type regions can be implanted with arsenic using an energy of 0.5 keV to 5.0 keV with a dose of $3\times10^{13}$ atoms/cm$^2$ to $3\times10^{16}$ atoms/cm$^2$.

Following extension region implant, a source and drain spacer 45 is formed by depositing a conformal film, such as SiN, and next removing the SiN from the horizontal surfaces using a highly directional dry etch process. The source and drain spacer 45 may have a width ranging from 2 nm to 30 nm.

Following the formation of the source and drain spacer 45, a source region 55 and a drain region 60 may then be formed using an ion implantation process. The source region 55 and the drain region 60 may be formed having a conductivity type that is the same as the conductivity type of the extension regions 50. The source region 55 and the drain region 60 may be composed of a p-type dopant. P-type source regions 55 and p-type drain regions 60 are typically produced with group III-A elements. The source region 55 and drain region 60 may also be composed of an n-type dopant. N-type source regions 55 and N-type drain regions 60 are typically produced with group V elements. In the case of the p-type implants, a typical impurity species is boron or BF$_2$. Boron with an energy of 1 keV to 10 keV or BF$_2$ with an energy of 5 keV to 50 keV and a dose of $5\times10^{14}$ atoms/cm$^2$ to $5\times10^{15}$ atoms/cm$^2$ can be used to implant the p-type region. A typical implant for the n-type regions is arsenic. The n-type regions can be implanted with arsenic using an energy of 10 keV to 50 keV with a dose of $5\times10^{14}$ atoms/cm$^2$ to $5\times10^{15}$ atoms/cm$^2$.

Normal back end of the line (BEOL) processing may now be performed such as standard contact and wiring processes well known within the skill of the art.

FIGS. 5A and 5B depict one embodiment of a semiconductor device 100, such as a field effect transistor (FET) formed using a through the gate implant to form a first channel implant region 15 and a second channel implant region 20 in the channel portion of the semiconductor layer 5. In one embodiment, the semiconductor device 100 includes a substrate 55 including a semiconductor layer 6 overlying an insulating layer, e.g., buried insulating layer 4. A gate structure 55 is present on a channel portion of the semiconductor layer 6. A first channel implant region 15 is present in the channel portion of the semiconductor layer 6, in which a peak concentration of the first channel implant region 15 is present within the lower 25% of the thickness of the gate structure and the upper 25% of the thickness of the semiconductor layer 6. The peak concentration of the first channel implant region 15 may range from $1\times10^{17}$ cm$^{-3}$ to $1\times10^{19}$ cm$^3$. A second channel implant region 20 is present in the channel portion of the semiconductor layer 6, in which the peak concentration of the second channel implant region 20 is present within the lower 25% of thickness of the semiconductor layer 6. The peak concentration of the second channel implant region may range from $5\times10^{16}$ cm$^3$ to $1\times10^{19}$ cm$^{-3}$.

In one embodiment, the first channel implant region 15 and the second channel implant region 20 are doped to a p-type conductivity, and the semiconductor device further includes source regions and drain regions of an n-type conductivity. In another embodiment, the first channel implant region 15 and the second channel implant region 20 are doped to an n-type conductivity, and the semiconductor device further includes source regions and drain regions of a p-type conductivity.

The semiconductor device 100 may further include isolation region 7 that are present in the substrate 5. The upper surface of the isolation region 7 may be vertically offset from an upper surface of the semiconductor layer 6. The isolation region 7 may include a first isolation implant region 16 substantially adjacent to the first channel implant region 15, wherein the first channel implant region 15 and the first isolation implant region 16 may have the same conductivity. The isolation region 7 may also include a second isolation implant region 21 that is substantially adjacent to the second channel implant region 20, wherein the second channel implant region 20 and the second isolation implant region 21 are of the same conductivity.

Referring to FIG. 5B, as the thickness of the at least one gate conductor 9, i.e., gate height, increases there is a shift in the first channel implant region 15 and the second channel implant region 20 that are present in the channel portion of the semiconductor layer 5 in the direction towards the upper surface of the at least on gate conductor 9. The first channel implant region 15 is typically present proximate to the interface of the front gate structure 10 and the semiconductor layer 6 of the substrate 5, wherein the first channel implant region 15 contributes to controlling the threshold voltage of the semiconductor device controlled by the front gate structure 10. As the thickness of the at least one gate conductor 9, i.e., gate height, in increased, the first channel implant region 15 is shifted into the at least one gate conductor 9. The first channel implant region 15 may be of an opposite conductivity dopant as the at least one gate conductor 9. In one embodiment, because the concentration of the dopant for the first channel implant region 15 is much less than the dopant concentration of the at least one gate conductor 9, the presence of the first channel implant region 15 in the at least one gate conductor 9 does not affect the functionality of the at least one gate conductor 9. The second channel implant region 20 is typically present at the interface of the dielectric layer 3 and the base semiconductor substrate layer 2. The positioning of the second channel implant region 20 at the interface of the dielectric layer 3 and the base semiconductor substrate layer 2 contributes to controlling the threshold voltage of the semiconductor device that is controlled by the back gate structure.

As the first channel implant region 15 is shifted into the at least one gate conductor 9, as the result on increased gate height, the second channel implant region 20 is also shifted in a direction towards the upper surface of the at least one gate conductor 9 into closer proximity to the region of the semiconductor layer 6 that is underlying the gate structure 10. Therefore, the second channel implant region 20 contributes to controlling the threshold voltage of the semiconductor device controlled by the front gate structure 10. The second isolation implant region 21 that is present in the dielectric layer 3 simultaneously shifts with the second channel implant region 20. In one example, the second isolation implant region 21 shifts to be present within the source region 55 and the drain region 60. The second isolation implant region 21 typically has an opposite conductivity as the source region 55 and the drain region 60. In one embodiment, because the concentration of the dopant for the second isolation implant region 21 that is present in the source region 55 and a drain region 60 is much less than the source and drain dopant concentration, the presence of the second isolation implant region 21 in the source region 55 and a drain region 60 does not affect the functionality of the source region 55 and the drain region 60.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed:

1. A semiconductor device comprising:
   a gate structure present on a channel portion of a semiconductor layer;
   a first channel implant region present in the channel portion of the semiconductor layer, in which a peak concentration of the first channel implant region is present within a lower portion of the gate conductor and an upper portion of the semiconductor layer; and
   a second channel implant region present in the channel portion of the semiconductor layer, in which the peak concentration of the second channel implant region is present within the lower portion of the semiconductor layer.

2. The method of claim 1, wherein the lower portion of the gate conductor is a lower 25% of the thickness of the gate conductor, the upper portion of the gate conductor is an upper 25% of the thickness of the semiconductor layer, and the lower portion of the semiconductor layer is the lower 25% of the thickness of the semiconductor layer.

3. The semiconductor device of claim 2, wherein the first channel implant region and the second channel implant region are doped to a first conductivity type, the semiconductor device comprises source regions and drain regions of a second conductivity type.

4. The semiconductor device of claim 3, wherein the first conductivity type comprises an n-type dopant and the second conductivity type comprises a p-type dopant, or the first conductivity type dopant comprises a p-type dopant and the second conductivity dopant comprises an n-type dopant.

5. The semiconductor device of claim 1, wherein the peak concentration of the first channel implant region ranges from $1\times10^{17}$ cm$^{-3}$ to $1\times10^{19}$ cm$^{-3}$.

6. The semiconductor device of claim 1, wherein the peak concentration of the second channel implant region ranges from $5\times10^{16}$ cm$^{-3}$ to $1\times10^{19}$ cm$^{-3}$.

7. The semiconducting device of claim 1 further comprising isolation regions present in the substrate, wherein an upper surface of the isolation regions is vertically offset from an upper surface of the semiconductor layer.

8. The semiconductor device of claim 7, wherein the isolation regions further comprise a first isolation implant region substantially adjacent to the first channel implant region, wherein the first channel implant region and the first isolation implant region are of the same conductivity.

9. The semiconductor device of claim 7, wherein the isolation regions further comprise a second isolation implant region substantially adjacent to the second channel implant region, wherein the second channel implant region and the second isolation implant region are of the same conductivity.

10. The semiconductor device of claim 1, wherein the gate structure has a height ranging from 20 nm to 200 nm.

11. The semiconductor device of claim 7, wherein the upper surface of the isolation region is above the upper surface of the channel portion of the semiconductor layer by a step height of 30 nm or less.

12. The semiconductor device of claim 7, wherein the upper surface of the isolation region is above the upper surface of the channel portion of the semiconductor layer by a step height ranging from 5 nm to 30 nm.

13. The semiconductor device of claim 7, wherein the upper surface of the isolation region is above the upper surface of the channel portion of the semiconductor layer by a step height ranging from 10 nm to 25 nm.

14. The semiconductor device of claim 1, wherein the semiconductor layer is a top semiconductor layer of an SOI substrate.

15. The semiconductor device of claim 12, wherein the top semiconductor layer has a thickness ranging from 10 nm to 150 nm.

16. The semiconductor device of claim 12, wherein the top semiconductor layer is selected from the group consisting of Si, Ge alloys, SiGe, GaAs, InAs, InP, SiCGe, SiC, III/V compound semiconductors, II/VI compound semiconductors or a combination thereof.

17. The semiconductor device of claim 1, wherein the gate structure comprises at least one gate conductor on gate dielectric.

18. The semiconductor device of claim 17, wherein the at least one gate conductor comprises polysilicon, elemental metals, metal alloys, metal silicides or a combination thereof.

19. The semiconductor device of claim 1, wherein the peak concentration of the first dopant in the first channel implant region 15 ranges from $2\times10^{18}$ atoms/cm$^3$ to $4\times10^{18}$ atoms/cm$^3$.

20. The semiconductor device of claim 1, wherein the peak concentration of the first dopant in the first channel implant region 15 ranges from $2.5\times10^{18}$ atoms/cm$^3$ to $3.5\times10^{18}$ atoms/cm$^3$.

* * * * *